(12) United States Patent
Yao (10) Patent No.: US 9,179,575 B1
(45) Date of Patent: Nov. 3, 2015

(54) MEMS BASED DEVICE FOR PHASE-CHANGE AUTONOMOUS TRANSPORT OF HEAT (PATH)

(75) Inventor: Qizhou Matthew Yao, Coralville, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 354 days.

(21) Appl. No.: 13/418,710

(22) Filed: Mar. 13, 2012

(51) Int. Cl.
   *H05K 7/20* (2006.01)

(52) U.S. Cl.
   CPC .................................. *H05K 7/20* (2013.01)

(58) Field of Classification Search
   None
   See application file for complete search history.

(56) References Cited

U.S. PATENT DOCUMENTS

| | | | |
|---|---|---|---|
| 5,257,660 A | 11/1993 | Cargile | |
| 6,827,133 B1 | 12/2004 | Luo | |
| 7,021,369 B2 * | 4/2006 | Werner et al. | 165/104.33 |
| 7,104,312 B2 | 9/2006 | Goodson et al. | |
| 7,185,697 B2 * | 3/2007 | Goodson et al. | 165/104.33 |
| 2004/0093887 A1 * | 5/2004 | Shyy et al. | 62/259.2 |
| 2004/0112585 A1 * | 6/2004 | Goodson et al. | 165/299 |
| 2005/0144968 A1 * | 7/2005 | Shakespeare | 62/298 |
| 2006/0065386 A1 | 3/2006 | Alam | |
| 2008/0128898 A1 * | 6/2008 | Henderson et al. | 257/713 |
| 2010/0326627 A1 * | 12/2010 | Schon | 165/104.21 |

* cited by examiner

*Primary Examiner* — Courtney Smith
(74) *Attorney, Agent, or Firm* — Angel N. Gerdzhikov; Donna P. Suchy; Daniel M. Barbieri (57) ABSTRACT

The present invention includes a MEMS-based cooling system that can be passive or active in accordance with an embodiment of the present invention is disclosed. The MEMS-based cooling system has an expandable MEMS device that is a MEMS device that has one or more expandable chambers to help transfer heat autonomously from a heat source using a working fluid and one or more MEMS directional devices that can control the flow of the working fluid through one or more cooling channels that enable heat transfer from one or more heat sources to one or more heat sinks via the working fluid.

18 Claims, 7 Drawing Sheets

Schematic drawing of MEMS based PATH

Internal temperature and pressure of the evaporator with water as the phase-change fluid operating at sea level

| Property | PATH | Heat Pipe | Thermo-syphone | Liquid Cooling |
|---|---|---|---|---|
| High heat flux transfer (w/cm², source to sink) | 5-2000 | 50-100 | <250 | 1-100 |
| Maintains constant heat source temperature upper limit at variable thermal load | YES | NO | NO | NO |
| Small, light, & compact (no active component) | YES | YES | NO | NO |
| Quiet in operation and reliable | YES | YES | YES | NO |
| Independent of gravity and orientation | YES | NO | NO | YES |
| Require no external power, self-start & autonomous | YES | YES | YES | NO |
| Simple device and low manufacturing cost | YES | YES | NO | NO |
| Scalable | YES | NO | NO | NO |
| Reconfigurable | YES | NO | NO | YES |

PATH device with parallel heat sources in a multipath loop

FIG. 7

PATH device with parallel heat sources in independent loops

FIG. 8

PATH device with series heat sources

MEMS BASED DEVICE FOR PHASE-CHANGE AUTONOMOUS TRANSPORT OF HEAT (PATH)

FIELD OF THE INVENTION

The present invention relates generally to heat transfer MEMS device systems, and, more specifically, to efficient heat transfer device systems incorporating micro-electromechanical systems (MEMS) components when filled with a supercritical fluid that transports heat from the devices to a remote heat sink.

BACKGROUND OF THE INVENTION

Cooling electrical devices continues to challenge manufactures as the size of these devices continue to get smaller and the functionality of these devices continues to get greater. Since most electrical devices operate most effectively, if at all, within a narrow temperature range controlled cooling is essential to the device. All this is required in the smallest space possible. The existing heat transfer technologies such as Heat Pipe, Loop Heat Pipe, Thermo syphon, Heat Pump, Pumped-fluid cooling, Spray and Jet Impingement cooling, etc. have major limitations that do not work to provide sufficient solutions to these problems.

MEMS technologies are reaching a point of maturity where they can be fabricated with accuracy and extremely small size since a MEMS-based thermal cooling system overcomes one or more of these problems.

SUMMARY OF THE INVENTION

The present invention is directed to a MEMS-based thermal system, such as a cooling system, that can be passive or active in accordance with an embodiment of the present invention is disclosed. The MEMS-based cooling system has an expandable MEMS device that is a MEMS device that has one or more expandable chambers to assist liquid flow and transfer heat autonomously from a heat source using a working fluid and one or more MEMS directional devices that can control the flow of the working fluid through one or more cooling channels that enable heat transfer from one or more heat sources to one or more heat sinks via the working fluid.

The MEMS cooling system transfers heat from a heat source to a heat sink, allowing the MEMS cooling system to move the working fluid through one or more directional devices, such as check valves or MEMS check valves, to control one or more cooling channels that run between a heat source and a heat sink. The MEMS cooling system regulates the transfer of heat from one or more heat sources to the one or more heat sinks via one or more cooling channels. The working fluid is disposed in the expandable MEMS device to transfer heat from the heat source to the heat sink in a progressive nature such that as pressure increases, more MEMS sub-chambers are activated accordingly to accommodate the volume needed for the working fluid. This can be an effectively passive system by allowing the working fluid to changes from liquid to vapor in the heat source and changes from vapor to liquid in the heat sink.

In one preferred embodiment parts or all of the MEMS cooling system can be incorporated into one or more integrated circuit chip. The one or more cooling channels include one or more spaces formed between the heat source and the heat sink allowing the working fluid to be in this space. Examples of possible MEMS devices are selected from the group including electromagnetic, electrostatic, piezoelectric, bimetallic, thermo pneumatic, or shape memory alloy based expandable structures and MEMS directional devices, such as shape memory alloy or spring based valves and switches.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

DETAILED DESCRIPTION

The present invention includes a system and related method for a MEMS-based thermal system that can be either a cooling or heating system using a Phase-Change Autonomous Transport of Heat (PATH) process that is a novel, two-phase, passive or active, and highly advanced heat transfer technology that makes the MEMS-based system of the present invention capable of transferring significant amounts of heat through thin passages at a very high heat transfer coefficient over long distance.

MEMS-based thermal systems are useful when highly reliable, maintenance free, gravity and/or orientation independent devices. The MEMS-based thermal systems are preferred since they can maintain almost constant heat source temperatures over a variable thermal load. Hereafter the description will refer to the MEMS-based thermal systems as simply cooling systems since this makes the description simpler. It is well known that these same concepts can be used to make one or more heating systems or heating and cooling systems working together in combination and are not meant to limit the use of the present invention for any necessary thermal transfer requirements.

The present invention can improve thermal payload and system power density, as well as functionality (particularly for highly constrained microelectronic devices), and significantly enhance system reliability for avionics and other electronics for existing and future equipment since it can be scaled down to extremely small form factor suitable for chip level cooling. It could also be made reconfigurable to meet various levels of thermal load operating environment.

The present invention is a MEMS-based cooling system made from a combination of evaporator, condenser, MEMS check valves, MEMS expansion chamber, phase-change fluid, and flexible tubings. While idle, the system is completely filled with a phase-change fluid and an expansion chamber remains flaccid. Operation of the MEMS-based cooling system starts automatically when the heat source temperature reaches the boiling point of the phase-change fluid inside the evaporator. The system operates periodically in the following two sequential and repeating states, the vapor transfer state, and the condensate return state. When the liquid in the evaporator reaches the boiling point, saturated vapor start to move toward the condenser where vapor is condensed back to liquid. Initially, the evaporation rate is greater than condensation rate, resulting in the continuous increase of the system pressure. As the liquid inside the evaporator continues to evaporate, condensed liquid coming out of the condenser is pushed pass the MEMS check valve 1 into the MEMS expansion chamber. As the liquid in the evaporator starts to dry out, the rate of condensation exceeds the rate of evaporation, resulting in the decrease of the pressure inside the evaporator while the pressure at the expansion chamber remains roughly at the atmospheric pressure. When the pressure difference between the evaporator and expansion chamber reaches the crack pressure of the MEMS check valve 2, liquid automatically flows pass the check valve 2 and into the evaporator, and a new operating cycle begins.

Figure 1:
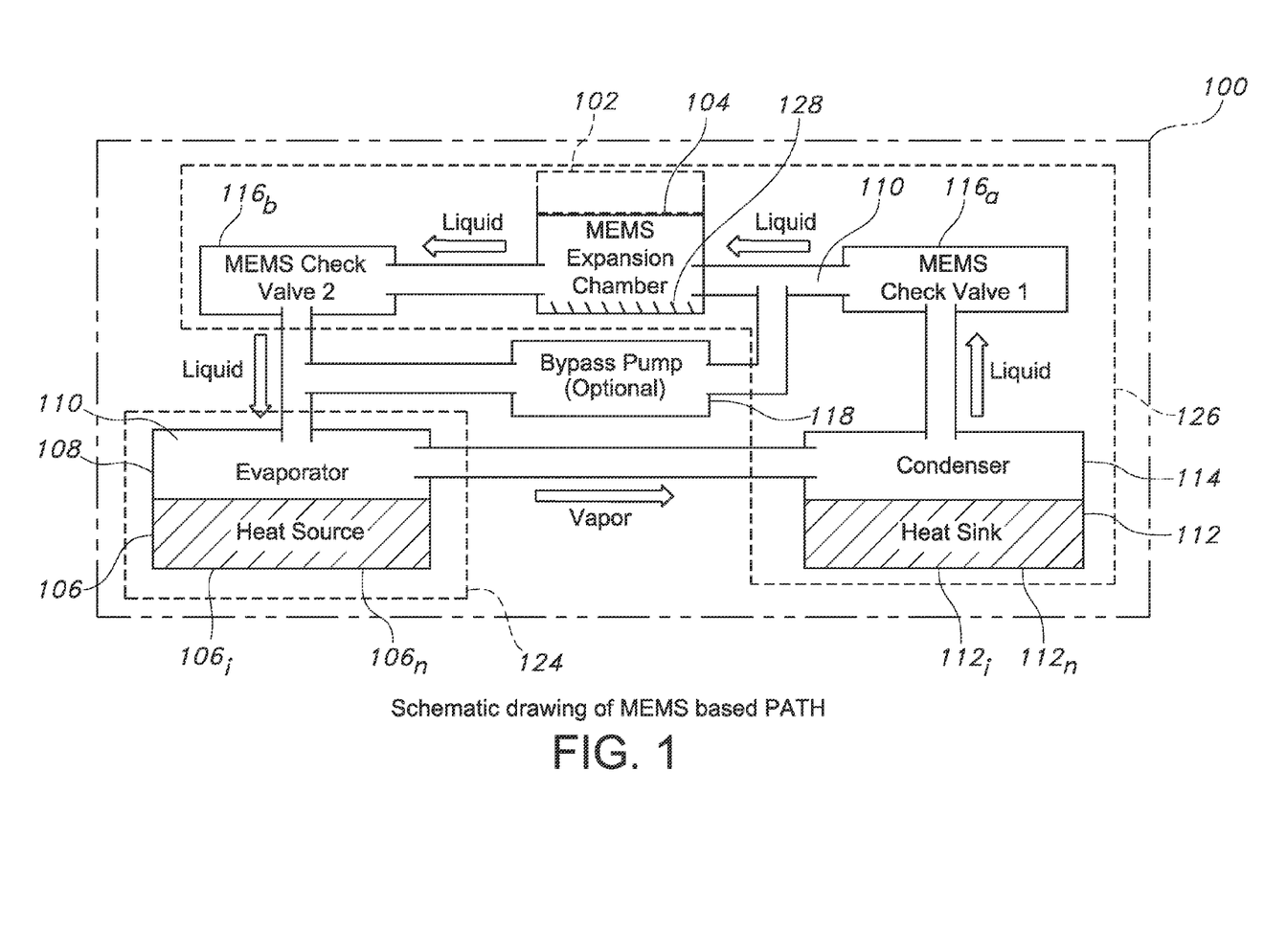
FIG. 1 depicts a schematic drawing of one embodiment of the MEMS based PATH cooling system in accordance with an embodiment of the present invention.

FIG. 1 shows a MEMS-based system 100, also sometimes referred to as a MEMS cooling system, having two-phase loop cooling that can be passive or active in accordance with an embodiment of the present invention is disclosed. Note that since the MEMS-based system 100 is a heat transfer system it can be used alternately for heating and/or cooling as is required but for clarity the system will be described being used as a MEMS cooling system first. The MEMS-based cooling system has an expandable MEMS device 102 that has one or more expandable chambers 104 as shown as is sometimes referred to a MEMS cooling device 102. The MEMS system of the present invention 100 is used to facilitate heat transfer so there are configurations that can also be used for heating as will be described in more detail below. The MEMS cooling system transfers heat autonomously from a heat source 106 which may be coupled or integrated with the MEMS evaporator 108, capable of containing a working fluid 110, to heat sink 112 which may be coupled or integrated with the MEMS condenser 114. The system also includes one or more directional device(s) 116 that are shown in in one embodiment as one or more MEMS check (directional) valves 116a and 116b, one or more optional bypass pump(s) 118, and various interconnect tubings 120. The working fluid can be, without limitation, one of a sulfur hexafluoride or a fluorocarbon or any combination therein. The thermal communication means that there is at least the unilateral transfer of thermal energy from one or more heat sources to one or more heat sinks Other working fluids having even better heat transfer characteristics may also be used. Possible alternative working fluids include but are not limited to water, ethanol, methanol, acetone, R-113, and engineered heat transfer fluids such as fluorocarbons sold under the trademark "Fluorinerts" which are inert, and are designed to cover a wide range of temperatures.

The directional devices 116 can control, and if necessary control in a regulating manner, the flow of the working fluid 110. The MEMS directional devices can be made up of MEMS directional valves or check valves for example, which can be a MEMS device themselves. This will be described in more detail below but is not meant to be limited to a separate device and may include phase change states of a device.

One or more cooling channels 122 enable heat transfer from one or more heat sources 106i-106n to one or more heat sinks 112i-112n via the working fluid. In one preferred embodiment the heat source 106 and evaporator 108 can be incorporated into an integrated circuit chip 124, while the other parts of the MEMS cooling system, except the optional bypass pump, can be incorporated into a MEMS chip 126 and the working fluid changes phase from a liquid to a vapor in the integrated circuit chip 124 and changes phase from a vapor to a liquid in the MEMS chip 126.

In one embodiment the one or more cooling channels 122 can be formed between the heat source and the heat sink allowing the working fluid to be in these channels. Examples of possible MEMS devices are selected from the group including electromagnetic, electrostatic, piezoelectric, bimetallic, thermo-pneumatic, or shape memory alloy based expandable structures and directional devices, such as shape memory alloy or flap based valves and switches.

In one embodiment the MEMS cooling system 100 can be passive and the working fluid 110 is simply self-controlled by the fluid itself that controls the one or more check valves in conjunction with the changing phase and relative temperatures and pressures of the working fluid 110. Alternatively, in an active system the MEMS-based cooling device 100 can be actively controlled by controlling system components, such as the MEMS check valves 116 and additional components, such as one or more embedded bypass pump(s) 118.

In another embodiment of the active system, the bypass pump(s) 118 can be disposed in the MEMS cooling system 100 to assist the flow of working fluid to cool the electronic device. In these embodiments the working fluid can be provided to one or more heat sources 106i-106n in series or in parallel. The MEMS cooling system 100 can also include one or more baffles 128 disposed in the MEMS cooling system to direct a convective flow of the working fluid therein. As is well known, as the working fluid absorbs energy from the heat source, its temperature arises until it reaches its boiling point when the fluid starts to evaporate and the pressure increases and the higher pressure vapor moves through the system transferring heat as it moves from the evaporator to the condenser. This vapor transfer state begins when boiling initiates inside evaporator. Elevated pressure due to vaporization starts pushing liquid out from the forward tube and condenser through the first MEMS check valve 116a and into the MEMS expansion chamber 104. The second MEMS check valve 116b remains closed at this time. Vapor is condensed back to liquid as it flow through the condenser 114. Both MEMS check valves (116a, 116b) are one-way allowing fluid flow in only one direction. Since both MEMS check valves are downstream relative to the condenser, they only see liquid but not vapor. Initially, the evaporation rate at the evaporator is much greater than the condensation rate at the condenser. The pressure inside the evaporator is higher than the pressure inside the condenser which is slightly higher than the ambient pressure outside the expansion chamber 104, resulting in vapor flow from the evaporator 110 to the condenser 114 and liquid flow from the condenser 114 through the check valve 116a into the expansion chamber 104.

Starting from flaccid, the MEMS expansion chamber 104 expands without significantly increasing system pressure and provides room for incoming liquid. As more vapor enters the condenser, the condensation rate increases, resulting in reduction of vapor pressure at the condenser. High vapor pressure pushes out liquid that is replaced with vapor until the vapor volume inside the condenser is high enough that the vapor pressure decreasing rate which follows condensation rate in the condenser becomes equal to the vapor pressure increasing rate which follows evaporation rate in evaporator. At this time, the evaporation rate is equal to the condensation rate; the pressure inside the evaporator is equal to the pressure inside the condenser which in turn is equal to the ambient pressure outside the expansion chamber 104, resulting the closure or check valve 116a.

As the evaporation process continues, all liquid from the evaporator 108 is vaporized and therefore the steady pressure increase inside the evaporator suddenly comes to an end. On the other hand, the pressure reduction rate in the condenser 114 remains the same since the condenser still remain filled with saturated vapor and condensation continues. At this time, the pressure inside evaporator 110 and condenser 114 is becoming much lower than the ambient pressure outside the expansion chamber 104 which remains at ambient pressure. Once the pressure difference reaches the crack pressure of the check valve 116b, liquid would automatically flow from the expansion chamber 104 into the evaporator 108 via check valve 116b. Thus the working fluid completes a cycle. The liquid flow repeats periodically as long as the MEMS cooling device 100 is in operation. The MEMS cooling device 100 will automatically adjust its operation (cycle frequency, volume occupied by vapor, rate of heat absorption and heat dissipation) depending on the thermal load at heat source, and the heat removal rate from heat sink.

Figure 2:
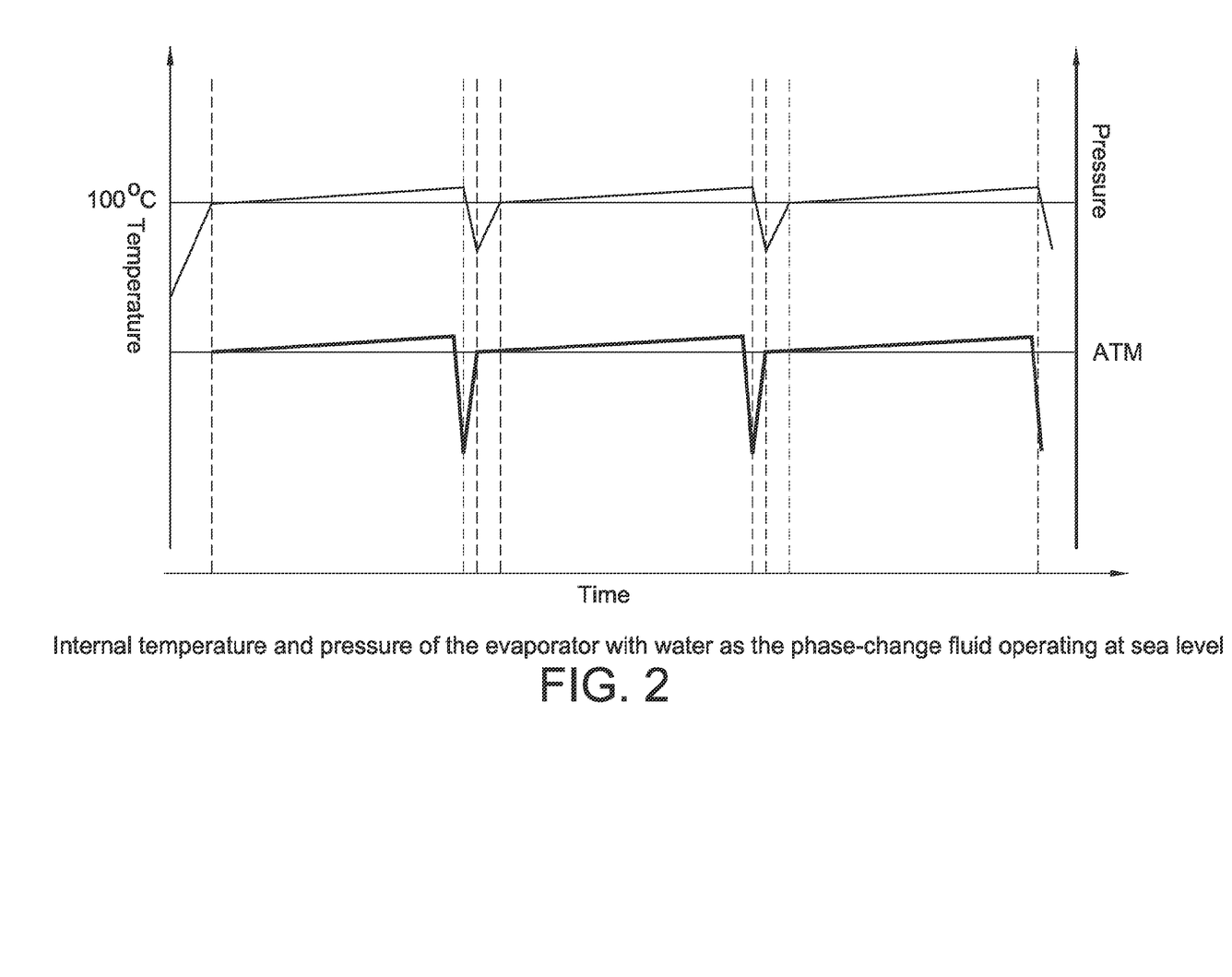
FIG. 2 depicts the internal temperature and pressure of the evaporator with water as the phase-chance fluid operating at sea level (normal atmospheric ambient pressure) in accordance with an embodiment of the present invention.

FIG. 2 shows typical internal temperature and pressure of the evaporator of a system including a MEMS cooling device 100 that uses water as the phase-change fluid 110. Due to nucleate pool boiling, the device can maintain nearly constant evaporator temperature over variable thermal loads working at normal atmospheric ambient pressure. The present invention is fundamentally different from conventional liquid and/or two-phase cooling technologies such as pumped liquid cooling, heat pipe, and thermosyphone systems.

Figure 3:
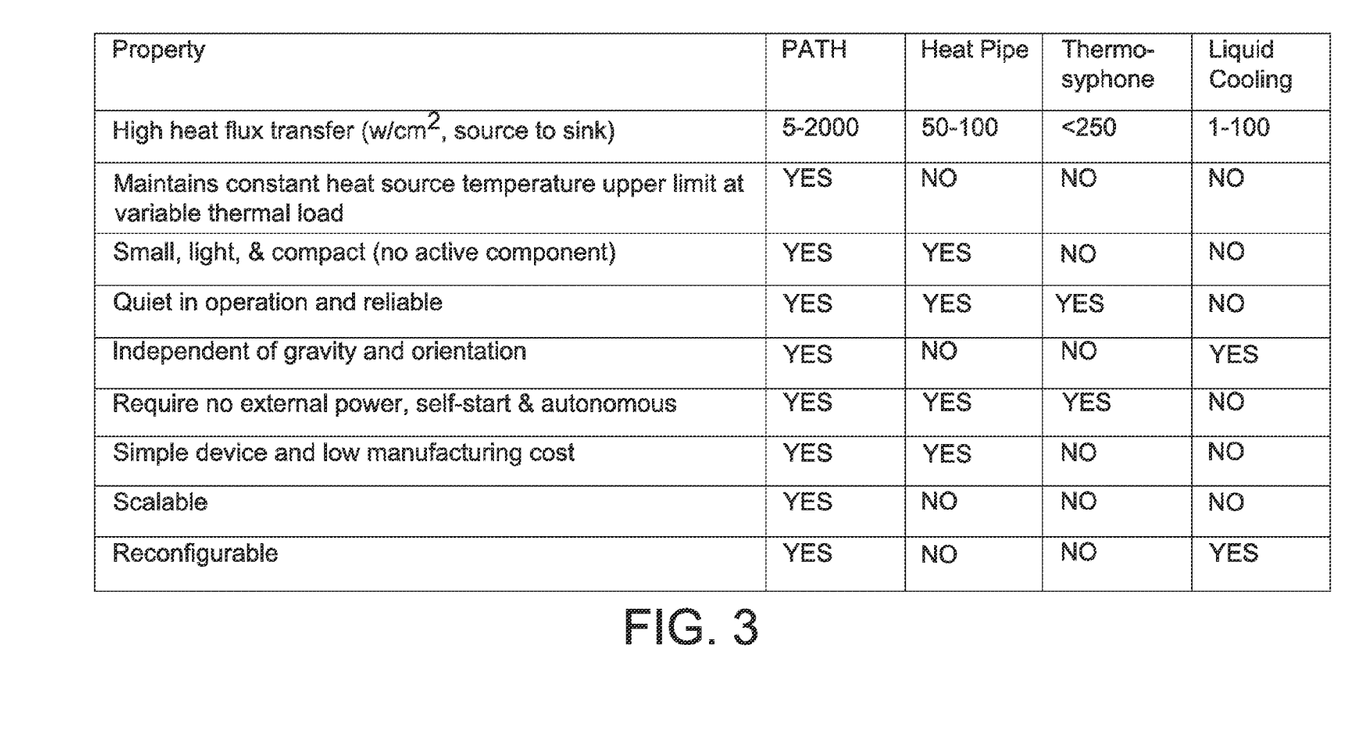
FIG. 3 is a table showing some advantages to use of the present inventions.

FIG. 3 includes a table illustrating some of the advantages of the present invention over those conventional cooling technologies. The key characteristic of this invention is that the autonomous liquid flow is driven by differential pressure associated with evaporation and condensation processes, instead of being driven by wicking, gravity, or an active pump in the above mentioned other technologies.

Figure 4:
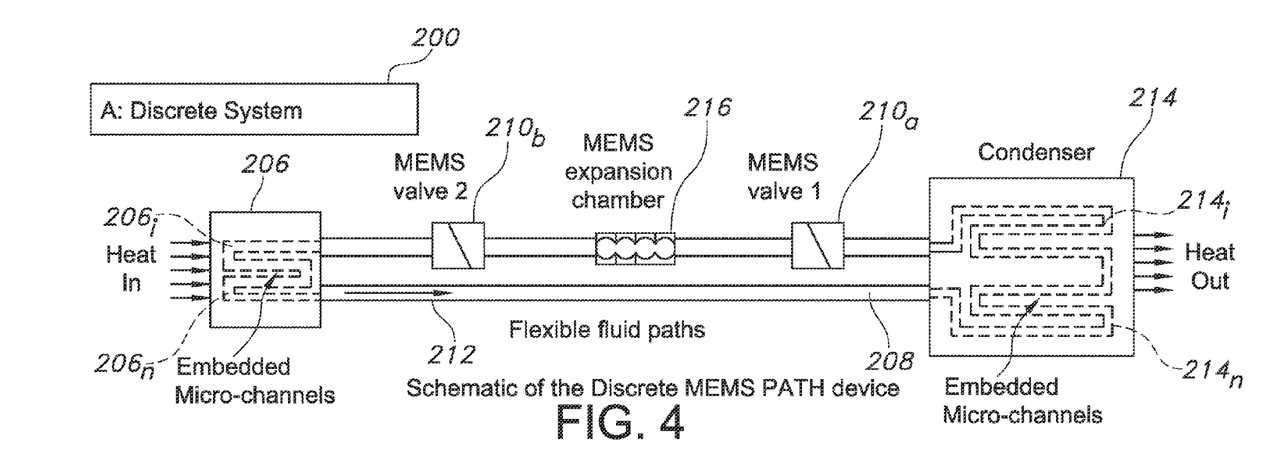
FIG. 4 is a schematic of the MEMS based PATH cooling system in accordance with an embodiment of the present invention.

FIG. 4 shows one embodiment of the MEMS cooling system. This first discrete MEMS system includes a miniaturized MEMS cooling system 200 having a heat source 206 with embedded micro-channels 206i-206n, a heat sink 214 with embedded micro-channels 214i-214n, two MEMS passive or active valves 210a, 210b, a MEMS expansion chamber 216, cooling channels 212, shown here as flexible fluid tubing 212, and a working fluid 208. This discreet MEMS-based cooling system 200 transfers heat from a heat source 206, made up of one or more chips with embedded microchannels 206i-n, capable of containing a working fluid 208, one or more directional devices 210a, 210b. One or more cooling channels 212 enable heat transfer from one or more heat sources 206 to one or more heat sink(s) 214 via periodic phase changes of the working fluid.

Figure 5:
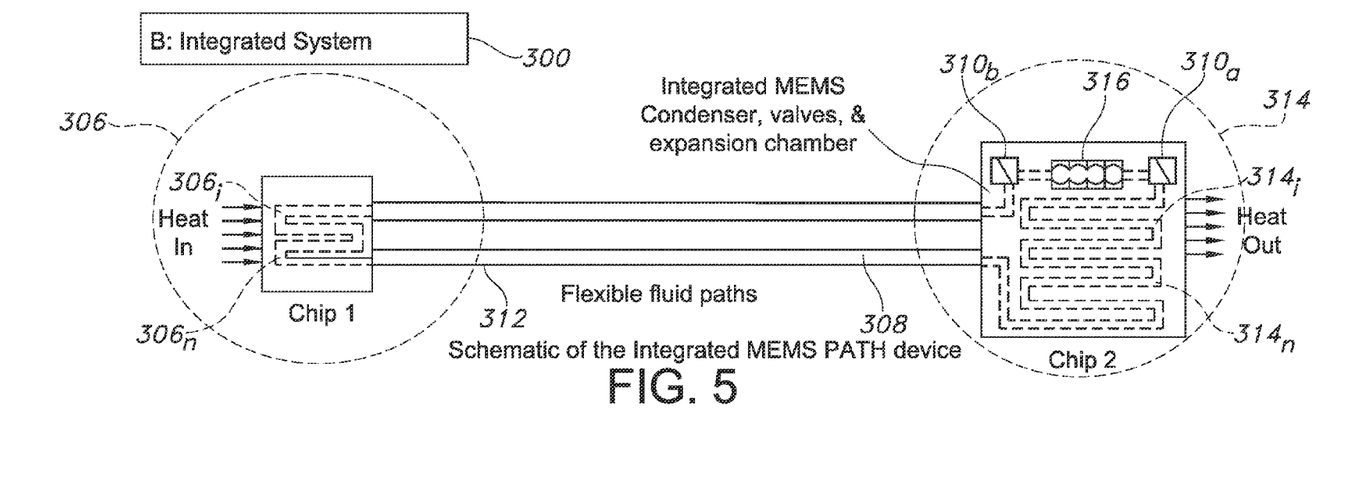
FIG. 5 is a schematic of the MEMS based PATH cooling system in accordance with an embodiment of the present invention.

Another embodiment of the MEMS cooling system 300 shown in FIG. 5. This embodiment has an integrated MEMS heat sink 314, directional valves 310a-b and an expansion chamber 316 as shown in FIG. 5. This miniaturized MEMS cooling system 300 has a heat source 306 with embedded micro-channels 306i-306n, an integrated heat sink 314 with embedded micro-channels 314i-314n, the two embedded MEMS passive or active valves 310a, 310b, an embedded MEMS expansion chamber 316, flexible fluid tubing 312, and a working fluid 308. This integrated MEMS-based cooling system 300 transfers heat from a heat source 306, made up of one or more chips with embedded microchannels 306i-n, capable of containing a working fluid 308, to one or more heat sinks 314 with integrated MEMS expansion chamber 316 and one or more directional valves 310a, 310b. The one or more cooling channel(s) 312 enable heat transfer from one or more heat sources 106 to one or more heat sinks 314 via the working fluid 308. This embedded embodiment of the MEMS-based cooling system enables great system reconfigurability. This embodiment provides easy assembly and disassembly of the system, allowing a designer to select appropriate heat source, tubing, integrated heat sink, as well as the working fluid based on thermal load and operating environment.

Figure 6:
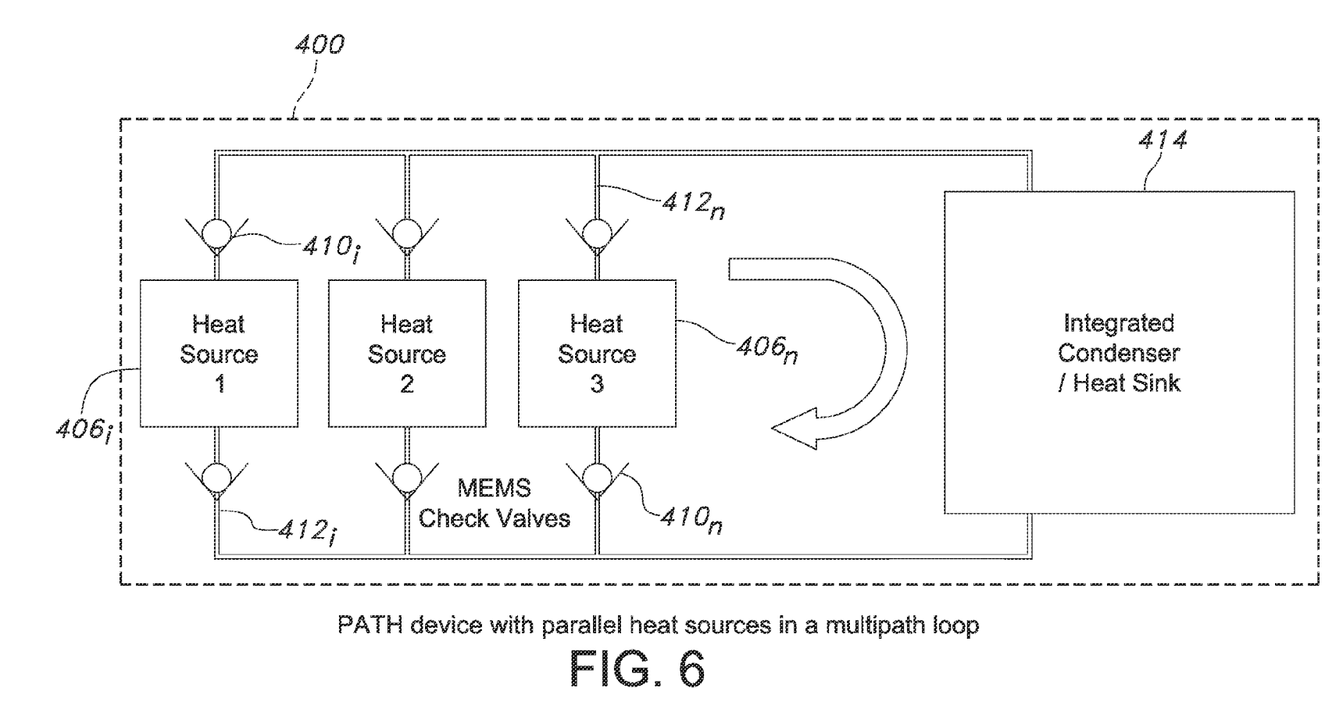
FIG. 6 depicts a MEMS PATH cooling system having parallel heat sources cooled by the system with a multipath loop in accordance with an embodiment of the present invention.
Figure 7:
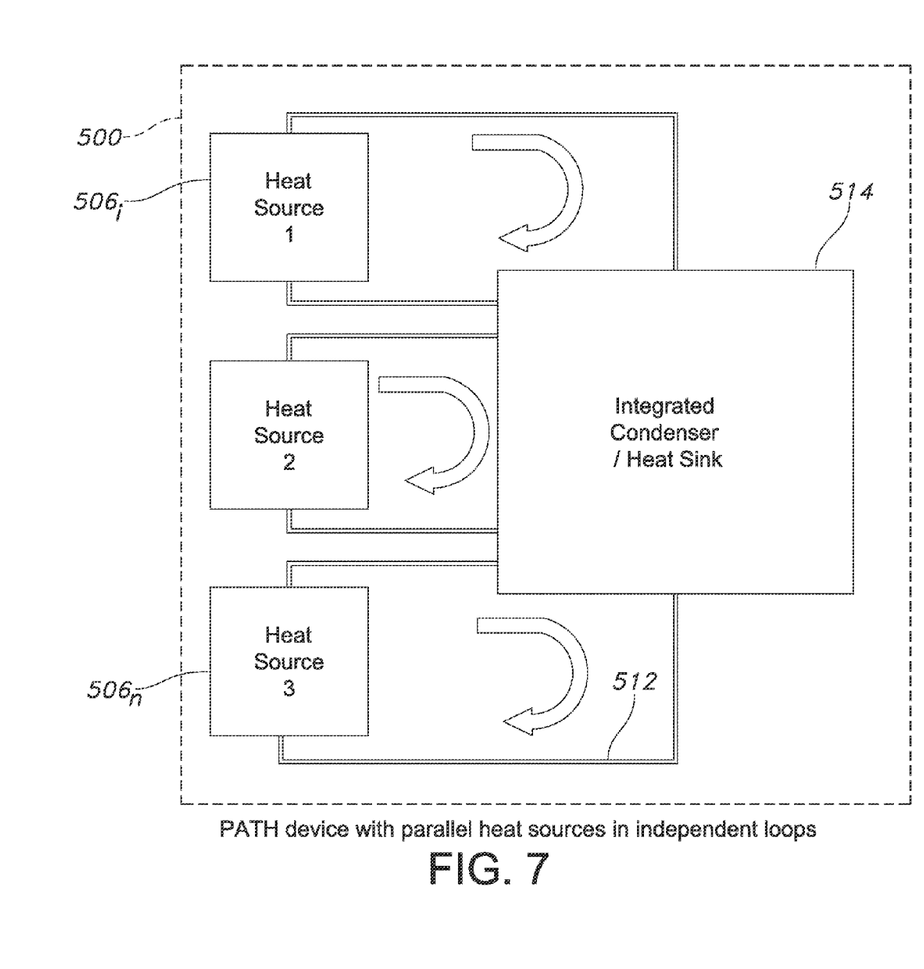
FIG. 7 depict a MEMS PATH cooling system having parallel heat sources cooled by the system with independent loops in accordance with an embodiment of the present invention.
Figure 8:
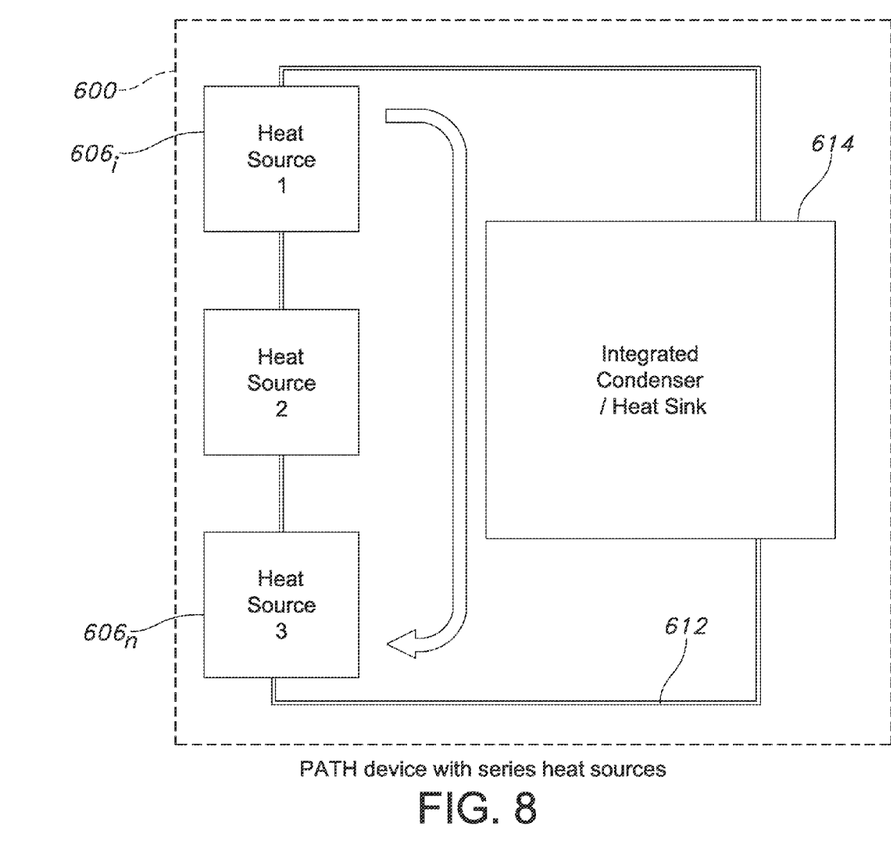
FIG. 8 depicts a MEMS PATH cooling system having series heat sources cooled by the system in accordance with an embodiment of the present invention.

The MEMS cooling system 300 described above can include one or more expandable MEMS devices that include heat sources that are distributed in parallel or in series as shown in FIGS. 6, 7, and 8. The integrated MEMS cooling systems 400, 500, and 600 are shown including multiple heat sources 406i-406n, 506i-506n, 606i-606n, MEMS directional valves 410i-410n, and an integrated MEMS heat sink 414, 514, 614 which is similar to 314 as described in the previous paragraphs. Similarly, one or more integrated MEMS heat sink(s) 414i-414n, 514i-514n, 614i-614n can be arranged in either parallel or in series. The MEMS based cooling system can include multiple channels 412i-n, 512i-n, 612 and transfer heat to heat sink 414, 514, 614 which include MEMS directional valves 410a, 410b, and MEMS controllable expansion chambers (not shown). The MEMS controllable expansion chamber can be of a progressive nature such that as pressure increases, more MEMS devices are activated accordingly to accommodate the volume needed for the working fluid.

These cooling systems can also be designed to cool multiple heat sources in parallel or in series. FIG. 5 shows a configuration where 3 or more heat sources 406i-406n are in parallel forming a multipath loop. In this parallel arrangement, each heat source 406i-406n is cooled separately but there are thermal interactions among the sub-loops as they share the manifold, MEMS directional valves 410i-410n, and MEMS expansion chamber where the working fluid flow through.

FIG. 6 shows a configuration where 3 heat sources 506i-506n are in parallel forming 3 independent loops. In this parallel arrangement, each heat source is cooled and its respective loop operates independently. There is no thermal interaction among these parallel loops other than they share the same heat sink, therefore the cooling capacity of each loop is related in such a way that the heat sink is able to reject the total heat brought from all the loops.

FIG. 7 shows a configuration where 3 heat sources 606i-606n are in series. In this series arrangement, the most active heat source would drive the liquid circulation through the loop, and the working fluid would by pass other heat sources without evaporation.

It is believed that the present invention and many of its attendant advantages will be understood from the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

Those skilled in the art may adapt and apply the invention in its numerous forms, as may be best suited to the requirements of a particular use. Accordingly, the specific embodiments of the present invention as set forth are not intended as being exhaustive or limiting of the invention. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes.

What is claimed is:

1. A MEMS based two-phase loop thermal system which transfers heat autonomously from one or more heat sources to a heat sink, comprising:
   a) one or more expandable MEMS devices containing a working fluid;
   b) one or more MEMS directional devices to control and regulate the flow of the working fluid;
   c) one or more cooling channels that enable heat transfer from the one or more heat sources to the heat sink via the working fluid; and
   d) a MEMS condenser adjacent to the heat sink to convert the working fluid from a vapor phase to a liquid phase, wherein the one or more expandable MEMS devices further contain expansion chambers, different from the one or more cooling channels, that are constructed in series or in parallel, making an integrated MEMS controllable expansion chamber.

2. The system of claim 1 wherein the working fluid changes phase from a liquid to a vapor in the one or more heat sources.

3. The system of claim 1 wherein parts or the entire MEMS system is incorporated into one or more integrated circuit chips.

4. The system of claim 1 wherein the one or more expandable MEMS devices is active.

5. The system of claim 1 further including baffles disposed to direct a convective flow of the working fluid therein.

6. The system of claim 1 which includes a by-pass pump disposed in the MEMS system to assist the flow of the working fluid.

7. The system of claim 1 wherein the one or more cooling channels comprises one or more spaces formed between the one or more heat sources and the heat sink allowing the working fluid to be in the one or more spaces.

8. The system of claim 1, wherein the one or more expandable MEMS devices are selected from the group comprising: electromagnetic, electrostatic, piezoelectric, bimetallic, thermopneumatic, and shape memory alloy based expandable structures and directional devices.

9. The system of claim 1, where the MEMS controllable expansion chamber is of a progressive nature such that as pressure increases, more expandable MEMS devices are activated accordingly to accommodate the volume needed for the working fluid.

10. The system of claim 1 wherein the working fluid is provided to the one or more heat sources in series or in parallel.

11. A method comprising:
   providing working fluid to an expandable MEMS device to transfer heat from a heat source to a heat sink;
   allowing the expandable MEMS device to move the working fluid through one or more directional devices to control one or more cooling channels that run between the heat source and the heat sink;
   converting the working fluid from a vapor phase to a liquid phase in a MEMs condenser adjacent to the heat sink;
   controlling the working fluid access to expansion chambers in the expandable MEMS device, where the expansion chambers, different from the one or more cooling channels, are alternately in series or in parallel, making a MEMS controllable expansion chamber.

12. The method of claim 11 in which the MEMS system regulates the transfer of heat from one or more heat sources to one or more heat sinks via the one or more cooling channels.

13. The method of claim 11 wherein the working fluid changes from liquid to vapor in the heat source.

14. The method of claim 11 wherein the working fluid is disposed in the expandable MEMS device to transfer heat from the heat source to the heat sink.

15. The method of claim 11, wherein the expandable MEMS device actively controls the working fluid with the one or more directional devices.

16. The method of claim 11, wherein the working fluid is disposed in the expandable MEMS device to transfer heat from the heat source to the heat sink in a progressive nature such that as pressure increases, more expandable MEMS devices are activated accordingly to accommodate the volume needed for the working fluid.

17. The system in claim 1, wherein the one or more MEMS directional devices are one-way valves allowing fluid flow in only one direction.

18. The method in claim 11, wherein the one or more directional devices are one-way valves allowing fluid flow in only one direction.

* * * * *